(12) United States Patent
Kokubun

(10) Patent No.: US 10,497,823 B2
(45) Date of Patent: Dec. 3, 2019

(54) LIGHT RECEIVING DEVICE AND METHOD OF MANUFACTURING LIGHT RECEIVING DEVICE

(71) Applicants: Kabushiki Kaisha Toshiba, Minato-ku (JP); Toshiba Electronic Devices & Storage Corporation, Minato-ku (JP)

(72) Inventor: Koichi Kokubun, Yokohama (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/130,375

(22) Filed: Sep. 13, 2018

(65) Prior Publication Data

US 2019/0288149 A1 Sep. 19, 2019

(30) Foreign Application Priority Data

Mar. 14, 2018 (JP) .................................. 2018-046725

(51) Int. Cl.
*H01L 27/14* (2006.01)
*H01L 31/107* (2006.01)
(Continued)

(52) U.S. Cl.
CPC .... *H01L 31/107* (2013.01); *H01L 31/022408* (2013.01); *H01L 31/035281* (2013.01); *H01L 31/18* (2013.01)

(58) Field of Classification Search
CPC ........... H01L 31/107; H01L 31/022408; H01L 31/18; H01L 31/035281
See application file for complete search history.

(56) References Cited

U.S. PATENT DOCUMENTS 8,008,741 B2 8/2011 Yamamura et al.
8,610,231 B2 12/2013 Yamamura et al.
(Continued)

FOREIGN PATENT DOCUMENTS

JP 5616552 9/2014
JP 2015-081863 4/2015
(Continued)

*Primary Examiner* — Ismail A Muse
(74) *Attorney, Agent, or Firm* — Oblon, McClelland, Maier & Neustadt, L.L.P.

(57) ABSTRACT

A light receiving device includes: first semiconductor layers provided on a first main surface of a semiconductor substrate and having a first conductivity type impurity at a first concentration; an insulating film provided between the first semiconductor layers; a photoelectric conversion element provided in the first semiconductor layer; a first electrode provided on the insulating film; and a second electrode provided on a second main surface opposite the first main surface of the semiconductor substrate. The photoelectric conversion element includes a second semiconductor layer provided at a predetermined depth from an upper surface of the first semiconductor layer and having a second conductivity type impurity at a second concentration, and a third semiconductor layer provided within the first semiconductor layer to surround a side surface and a lower surface of the second semiconductor layer and having the first conductivity type impurity at a third concentration higher than the first concentration.

13 Claims, 7 Drawing Sheets

(51) Int. Cl.
*H01L 31/18* (2006.01)
*H01L 31/0352* (2006.01)
*H01L 31/0224* (2006.01)

(56) References Cited

U.S. PATENT DOCUMENTS

| | | | |
|---|---|---|---|
| 8,969,990 B2 | 3/2015 | Nagano et al. | |
| 9,425,224 B2 | 8/2016 | Nagano et al. | |
| 9,435,686 B2 | 9/2016 | Nagano et al. | |
| 9,484,386 B2 | 11/2016 | Yamamura et al. | |
| 9,691,932 B2 * | 6/2017 | Sasaki | H01L 31/103 |
| 9,748,428 B2 | 8/2017 | Nagano et al. | |
| 9,773,935 B2 | 9/2017 | Nagano et al. | |
| 9,825,071 B2 | 11/2017 | Nagano et al. | |
| 9,899,434 B1 | 2/2018 | Kokubun | |
| 10,050,069 B2 | 8/2018 | Yamamura et al. | |
| 10,141,368 B2 * | 11/2018 | Ishida | H01L 21/3205 |
| 2009/0121306 A1 * | 5/2009 | Ishikawa | H01L 27/1446 257/438 |
| 2013/0187251 A1 * | 7/2013 | Yamamura | H01L 27/1446 257/438 |
| 2014/0263975 A1 * | 9/2014 | Nagano | H01L 27/144 250/208.2 |
| 2014/0291486 A1 * | 10/2014 | Nagano | H01L 31/107 250/208.2 |
| 2015/0108358 A1 | 4/2015 | Sasaki et al. | |
| 2016/0011323 A1 * | 1/2016 | Sasaki | G01J 1/44 250/370.08 |
| 2016/0276399 A1 | 9/2016 | Atsuta et al. | |
| 2017/0033137 A1 * | 2/2017 | Yamamura | H01L 27/1446 |
| 2018/0204860 A1 * | 7/2018 | Kokubun | H01L 27/1443 |
| 2019/0006399 A1 * | 1/2019 | Otake | H01L 27/1463 |
| 2019/0103501 A1 * | 4/2019 | Igarashi | H01L 27/14 |
| 2019/0181177 A1 * | 6/2019 | Kobayashi | H01L 27/14603 |

FOREIGN PATENT DOCUMENTS

| | | |
|---|---|---|
| JP | 5911629 | 4/2016 |
| JP | 5927334 | 4/2016 |
| JP | 2016-174048 | 9/2016 |

* cited by examiner

LIGHT RECEIVING DEVICE AND METHOD OF MANUFACTURING LIGHT RECEIVING DEVICE

CROSS-REFERENCE TO RELATED APPLICATIONS

This application is based upon and claims the benefit of priority from Japanese Patent Application No. 2018-046725, filed Mar. 14, 2018, the entire contents of which are incorporated herein by reference.

FIELD

Embodiments relate to a light receiving device and a method of manufacturing a light receiving device.

BACKGROUND

Background art relates to a light receiving device for connecting a series connection of a quenching resistor and an avalanche photodiode (hereinafter referred to as an APD) in parallel and measuring the number of incident photons. The APD is formed of silicon (Si), and the APD is referred to as silicon photomultipliers (SiPM). In the light receiving device, it is desired to increase light receiving sensitivity while preventing crosstalk between adjacent APDs from deteriorating.

DETAILED DESCRIPTION

According to one embodiment, a light receiving device includes: first semiconductor layers two-dimensionally provided on a first main surface of a semiconductor substrate and having a first conductivity type impurity at a first concentration; an insulating film provided between the first semiconductor layers on the first main surface; a photoelectric conversion element provided in the first semiconductor layer; a first electrode provided on the insulating film on the first main surface; and a second electrode provided on a second main surface opposite the first main surface of the semiconductor substrate.

The photoelectric conversion element includes a second semiconductor layer provided in a range of a predetermined depth from an upper surface of the first semiconductor layer on which the first electrode is disposed and having a second conductivity type impurity at a second concentration, and a third semiconductor layer provided within the first semiconductor layer to surround a side surface and a lower surface of the second semiconductor layer and having the first conductivity type impurity at a third concentration higher than the first concentration.

Hereinafter, a light receiving device and a method of manufacturing a light receiving device according to embodiments will be described in detail with reference to the accompanying drawings.

In addition, the embodiments are not limited by the current disclosures. Moreover, a cross-sectional diagram of the light receiving device used in the following embodiments is schematic, and a relationship between a thickness and a width of a layer, a ratio between thicknesses of respective layers, or the like may be different from actual ones.

First Embodiment

Figure 1:
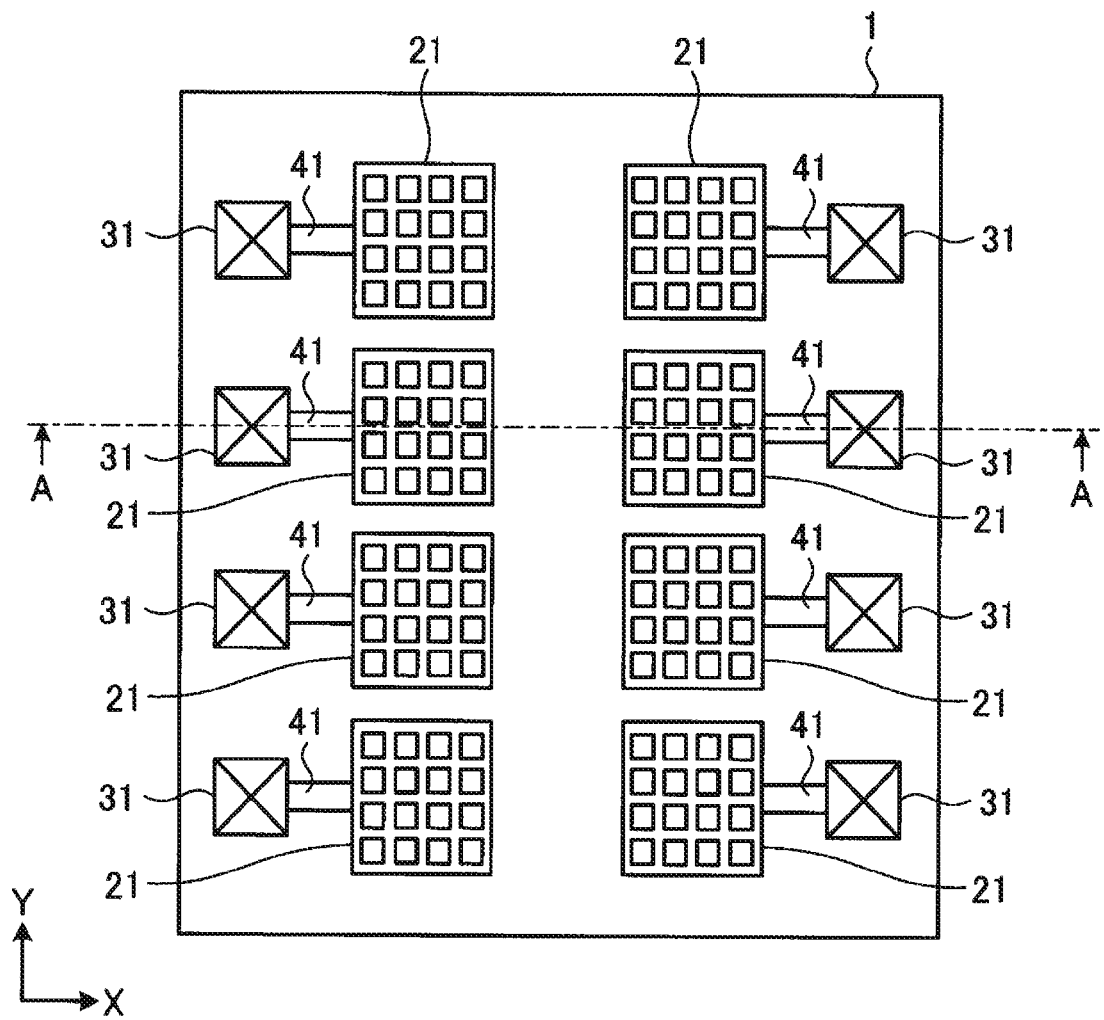
FIG. 1 is a plan diagram schematically showing an example of a configuration of a light receiving device according to a first embodiment.
Figure 2:
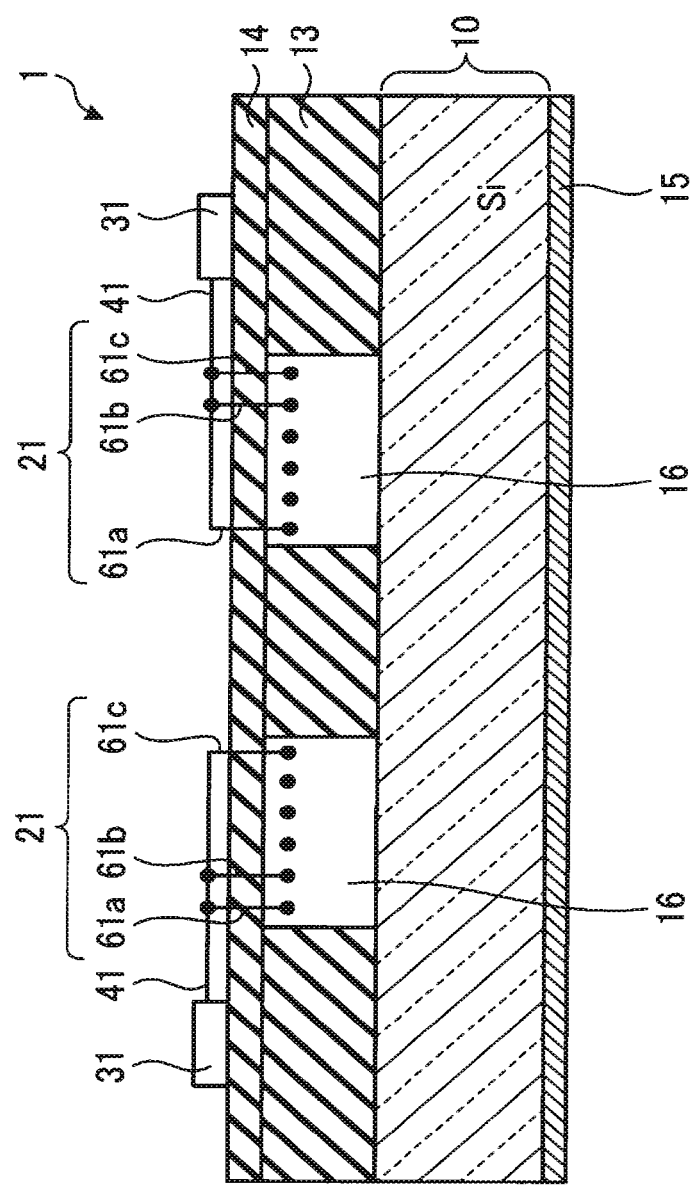
FIG. 2 is a cross-sectional diagram schematically showing an example of the configuration of the light receiving device according to the first embodiment taken along line A-A of FIG. 1.

FIG. 1 is a plan diagram schematically showing an example of a configuration of a light receiving device 1 according to a first embodiment. FIG. 2 is a cross-sectional diagram schematically showing an example of the configuration of the light receiving device 1 according to the first embodiment taken along line A-A of FIG. 1. The light receiving device 1 includes a plurality of pixel regions 21 in which a plurality of photoelectric conversion elements are formed on a silicon substrate 10. For example, the pixel regions 21 are two-dimensionally disposed on a main surface of the silicon substrate 10. For example, as the silicon substrate 10, a single crystal substrate can be used.

Each pixel region 21 includes an electrode pad 31 to which an output signal from the photoelectric conversion elements is supplied. Each pixel region 21 and each electrode pad 31 are connected to each other via a wire 41. For example, the electrode pad 31 is a bonding pad which is connected to an external electrode via a bonding wire (not shown).

Each pixel region 21 is formed in a Si epitaxial layer 16 provided on a front surface (hereinafter also referred to as a light receiving surface) of the silicon substrate 10. A separation film 13 is provided between respective pixel regions 21. For example, as the separation film 13, a silicon oxide film is used. A protective film 14 is provided on the front surface of each pixel region 21. For example, as the protective film 14, a silicon oxide film is used. The plurality of photoelectric conversion elements are provided in each pixel region 21. Each photoelectric conversion element is connected to a respective wire 41 via wires 61a to 61c.

A metal film 15 is formed on a rear surface of the silicon substrate 10. The metal film 15 functions as a reflective film which reflects incident light to the pixel region 21 side. The light reflected by the metal film 15 reaches the pixel region 21, and thus sensitivity of the photoelectric conversion element can be increased. In addition, the metal film 15 has a function as a common electrode of each photoelectric conversion element, in this case, an anode electrode. For example, as the metal film 15, aluminum, copper, gold, or the like can be used.

Figure 3:
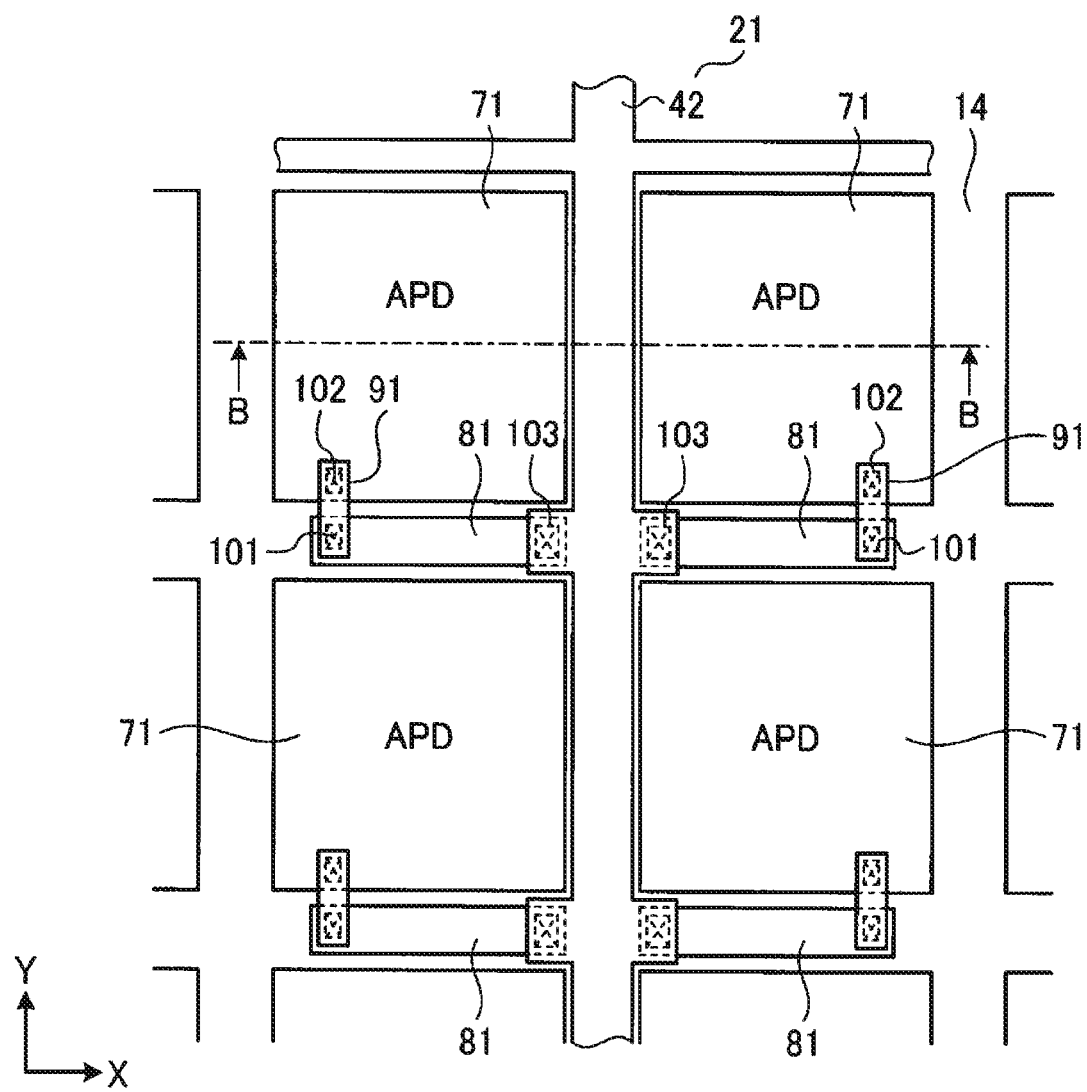
FIG. 3 is a plan diagram schematically showing a portion of a pixel region of the light receiving device according to the first embodiment.
Figure 4:
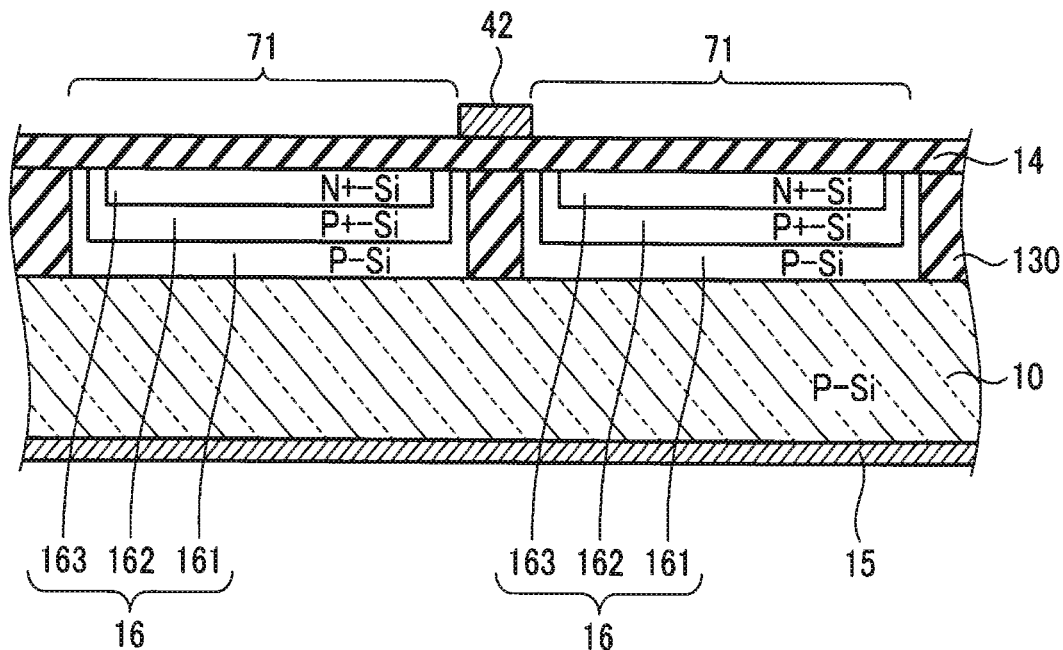
FIG. 4 is a cross-sectional diagram schematically showing a cross-sectional structure of the light receiving device according to the first embodiment taken along line B-B of FIG. 3.

FIG. 3 is a plan diagram schematically showing a portion of the pixel region of the light receiving device according to the first embodiment. FIG. 4 is a cross-sectional diagram schematically showing a cross-sectional structure of the light receiving device according to the first embodiment taken along line B-B of FIG. 3. A P type Si epitaxial layer 161 is provided on the P type silicon substrate 10 of the pixel region 21, and a photoelectric conversion element 71 is provided in the P type Si epitaxial layer 161. The photoelectric conversion element 71 is an APD operating in a Geiger mode. In the Geiger mode, a reverse bias voltage higher than a breakdown voltage is applied to a portion between an anode and a cathode of each APD.

The photoelectric conversion element 71 further includes a P+ type Si epitaxial layer 162 provided in the P type Si epitaxial layer 161 and an N+ type Si epitaxial layer 163 provided in the P+ type Si epitaxial layer 162. The P+ type Si epitaxial layer 162 and the N+ type Si epitaxial layer 163 constitute a PN junction of the photoelectric conversion element 71. A P type impurity concentration of the P+ type Si epitaxial layer 162 is higher than a P type impurity concentration of the P type Si epitaxial layer 161. For example, the P type impurity concentration of the P type Si epitaxial layer 161 is $1 \times 10^{15}/cm^3$, the P type impurity concentration of the P+ type Si epitaxial layer 162 is $7 \times 10^{16}/cm^3$ at a peak concentration, and the N type impurity concentration of the N+ type Si epitaxial layer 163 is $1 \times 10^{19}/cm^3$ at a peak concentration. The P type Si epitaxial layer 161, the P+ type Si epitaxial layer 162, and the N+ type Si epitaxial layer 163 constitute a Si epitaxial layer 16.

As shown in FIG. 3, each of the photoelectric conversion elements 71 has a rectangular shape in a plan view and the photoelectric conversion elements 71 are two-dimensionally disposed on the silicon substrate 10. Each photoelectric conversion element 71 has the same rectangular shape, and thus, more photoelectric conversion elements 71 can be disposed within a predetermined area. As shown in FIG. 4, a separation film 130 is provided between adjacent photoelectric conversion elements 71 on the silicon substrate 10. The separation film 130 may be formed of the same material as that of the separation film 13 separating the pixel regions 21, and, for example, is formed of a silicon oxide film. A distance between the adjacent photoelectric conversion elements 71, that is, a width of the separation film 130, can be set to a distance that a secondary photon generated in one of the adjacent photoelectric conversion elements 71 is attenuated and does not reach the other adjacent photoelectric conversion element 71. A protective film 14 is provided on the photoelectric conversion element 71 and on the separation film 130.

As shown in FIG. 4, an upper surface of the N+ type Si epitaxial layer 163 is in contact with the protective film 14, and the other surfaces thereof are in contact with the P+ type Si epitaxial layer 162. In this way, it is possible to increase the light receiving sensitivity by increasing a PN junction area.

In the example of FIG. 3, a quenching resistor 81 is provided on a portion of the protective film 14 extending in an X direction. The quenching resistor 81 has the function of terminating a multiplication function of the APD by a voltage drop in a case that the photon enters the APD and an electron avalanche occurs. For example, a resistance value of the quenching resistor 81 is set to approximately several hundred kΩ. For example, the quenching resistor 81 is formed of polycrystalline silicon.

In addition, an electrode film 42 is provided on a portion of the protective film 14 extending in a Y direction. The electrode film 42 is connected to the N+ type Si epitaxial layer 163 of each photoelectric conversion element 71 via a respective of the quenching resistors 81. Specifically, a wire 91 extending from one end of the respective quenching resistor 81 to the protective film 14 on the photoelectric conversion element 71 is provided. One end of the wire 91 is connected to the one end of the respective quenching resistors 81 via a connection portion 101. The other end of the wire 91 is connected to a connection portion 102 such as a via which is provided on the protective film 14 on the photoelectric conversion element 71 and reaches the N+ type Si epitaxial layer 163. For example, the via is formed of a metal material. The electrode film 42 is connected to the other end of each quenching resistor 81 via a connection portion 103. The electrode film 42 has a function as a cathode electrode of the photoelectric conversion element 71. In addition, as described above, the metal film 15 serving as an anode electrode is formed on the rear surface side of the silicon substrate 10.

Figure 5:
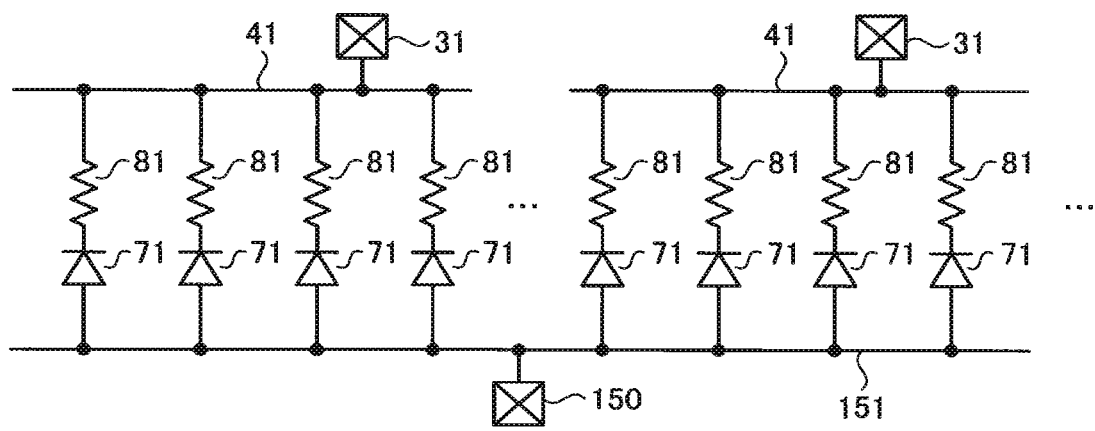
FIG. 5 is a diagram showing an equivalent circuit of a portion of the light receiving device of the first embodiment.

FIG. 5 is a diagram showing a portion of an equivalent circuit of the light receiving device of the first embodiment. An anode of each photoelectric conversion element 71 is connected to an anode electrode 150 via an anode wire 151. The metal film 15 shown in FIGS. 2 and 4 is used as the anode wire 151. In addition, the anode wire 151 is common to the respective pixel regions 21.

A cathode of the photoelectric conversion element 71 in each pixel region 21 is connected to the wire 41 provided for each pixel region 21 via the respective quenching resistor 81. The wire 41 is electrically connected to the electrode pad 31.

Figure 6A:
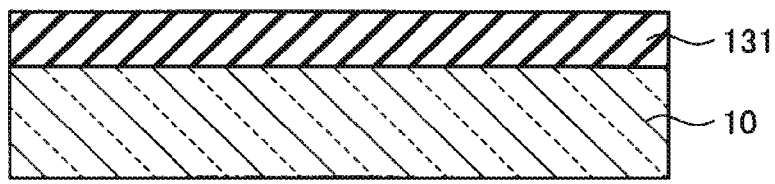
FIGS. 6A to 6F are cross-sectional diagrams schematically showing an example of a method of manufacturing the light receiving device according to the first embodiment.

Next, a method of manufacturing the light receiving device 1 having the above-described configuration will be described. FIGS. 6A to 6F are cross-sectional diagrams schematically showing an example of the method of manufacturing the light receiving device according to the first embodiment. First, as shown in FIG. 6A, for example, an insulating film 131 is formed on the main surface of the silicon substrate 10 by a film forming method such as a chemical vapor deposition (CVD) method. As the insulating film 131, a silicon oxide film or the like is used.

Figure 6B:
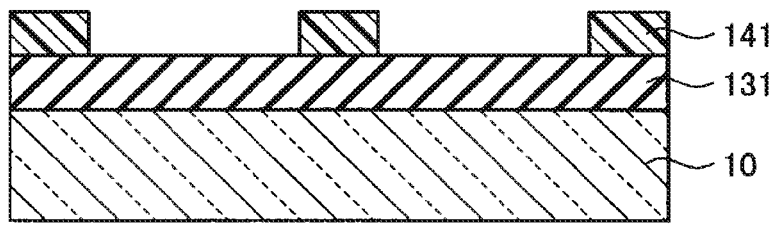

Next, a resist is applied to the insulating film 131. Thereafter, as shown in FIG. 6B, a pattern, in which a formation region of a photoelectric conversion element 71 is open, is used to expose the resist by a lithography technique, and then the exposed resist is developed to form a resist pattern 141.

Figure 6C:
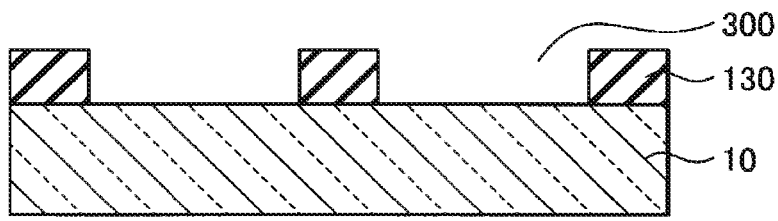

Next, as shown in FIG. 6C, by using the resist pattern 141 as a mask, the insulating film 131 is etched by anisotropic etching such as a reactive ion etching (RIE) method. Therefore, an opening 300 having a rectangular shape in a plan view is formed. As described above, the opening 300 is a region for forming the photoelectric conversion element 71. In addition, in the pixel region 21, the insulating film 131 becomes the separation film 130, and the insulating film 131 becomes the separation film 13 between the pixel regions 21.

Figure 6D:
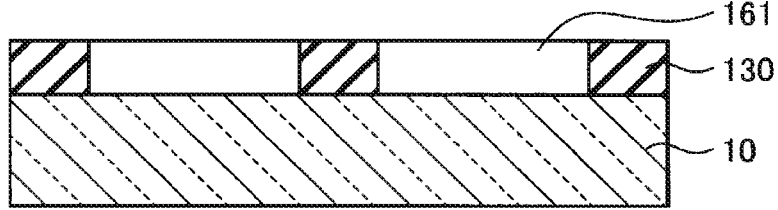

After the resist pattern 141 is removed, as shown in FIG. 6D, for example, a P type Si epitaxial layer 161 is selectively formed on the main surface of the silicon substrate 10 exposed by the opening 300 by a CVD method. For example, hydrogen ($H_2$) can be used as a carrier gas, dichlorosilane ($SiH_2Cl_2$) or hydrogen chloride (HCl) can be used as a gas species, and diborane ($B_2H_6$) can be used as a P type doping gas. For example, the P type impurity concentration of the P type Si epitaxial layer 161 is $1 \times 10^{15}/\text{cm}^3$.

Figure 6E:
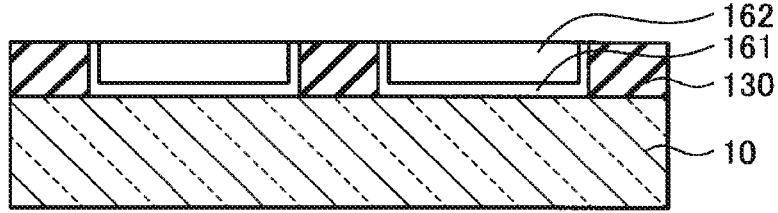

Next, as shown in FIG. 6E, a P type impurity is further introduced into the P type Si epitaxial layer 161 by an ion implantation method to form the P+ type Si epitaxial layer 162. For example, the P type impurity such as B is ion-implanted so that the P type impurity concentration becomes $7 \times 10^{18}/\text{cm}^3$ at the peak concentration. The P+ type Si epitaxial layer 162 is formed in a region which is shallower than the P type Si epitaxial layer 161 and which is the same as the P type Si epitaxial layer 161 or narrower than the P type Si epitaxial layer 161.

Figure 6F:
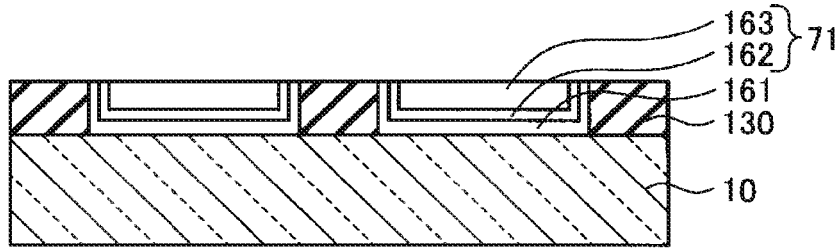

In addition, as shown in FIG. 6F, an N type impurity is introduced into the P+ type Si epitaxial layer 162 by an ion implantation method to form the N+ type Si epitaxial layer 163. For example, the N type impurity such as P or As is ion-implanted such that the N type impurity concentration is $1 \times 10^{19}/\text{cm}^3$ at the peak concentration. In addition, the N+ type Si epitaxial layer 163 is formed in a region which is shallower than the P+ type Si epitaxial layer 162 and narrower than the P+ type Si epitaxial layer 162.

Thereafter, the silicon substrate 10 is heat-treated to activate the P type impurity and the N type impurity introduced into the P type Si epitaxial layer 161, the P+ type Si epitaxial layer 162, and the N+ type Si epitaxial layer 163. Thereby, the photoelectric conversion element 71 having a PN junction in each opening 300 is formed.

Next, the protective film 14 is formed on the silicon substrate 10 on which the photoelectric conversion element 71 is formed. For example, as the protective film 14, a silicon oxide film or the like is used. Thereafter, a polysilicon film which becomes the quenching resistor 81 is formed via the protective film 14 at a predetermined position on the separation film 130. In addition, a contact hole reaching the N+ type Si epitaxial layer 163 is formed in the protective film 14 in the region in which the N+ type Si epitaxial layer 163 is formed, and thereafter, a conductive layer is formed on the entire surface of the protective film 14. Thereafter, patterning is performed such that the conductive film remains at a predetermined position on the separation film 130 and at a predetermined position connecting the contact hole and the quenching resistor 81 to each other. Accordingly, the electrode film 42 and the wire 91 are formed. In addition, the metal film 15 serving as an anode wire is formed on the entire rear surface of the silicon substrate 10, and the light receiving device 1 shown in FIGS. 1 to 3 is obtained.

Figure 7:
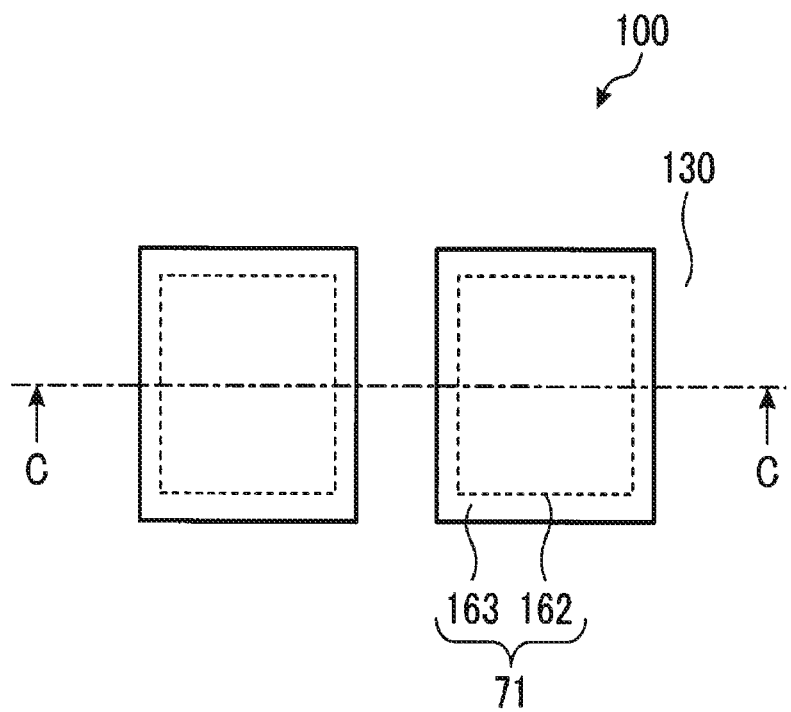
FIG. 7 is a plan diagram schematically showing a portion of a pixel region of a light receiving device according to a comparative example.
Figure 8:
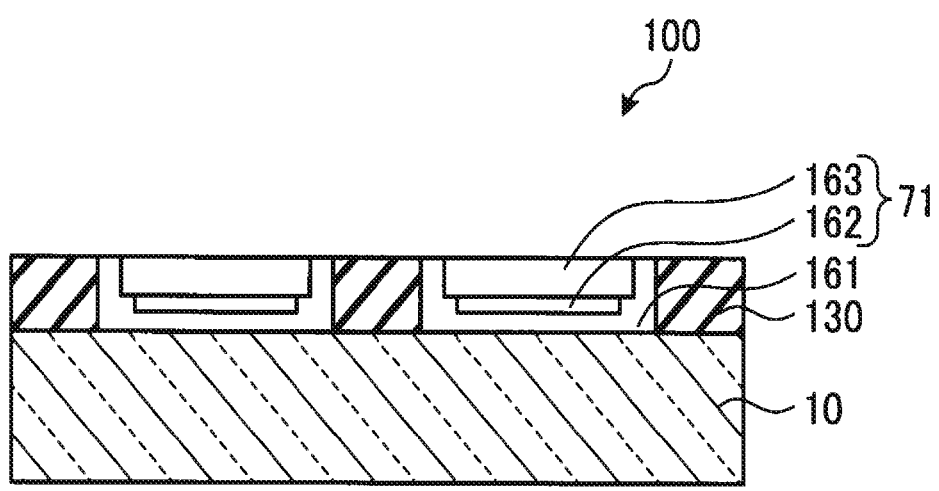
FIG. 8 is a cross-sectional diagram schematically showing a cross-sectional structure of the light receiving device according to the comparative example taken along line C-C of FIG. 7.

FIG. 7 is a plan diagram schematically showing a portion of a pixel region of a light receiving device according to a comparative example. FIG. 8 is a cross-sectional diagram schematically showing a cross-sectional structure of the light receiving device according to the comparative example taken along line C-C of FIG. 7. In addition, the protective film and a wiring layer such as a cathode wire, which are formed above the photoelectric conversion element, are omitted.

In the comparative example, the P type Si epitaxial layer 161 is disposed on a P type silicon substrate 10, and a photoelectric conversion element 71 is formed in the P type Si epitaxial layer 161. Similarly to the first embodiment, the separation film 130 formed of a silicon oxide film or the like is provided between the photoelectric conversion elements 71. The photoelectric conversion element 71 includes the P+ type Si epitaxial layer 162 provided at a predetermined depth from the upper surface of the P type Si epitaxial layer 161 and the N+ type Si epitaxial layer 163 which is in contact with the upper surface of the P+ type Si epitaxial layer 162 and provided above the P+ type Si epitaxial layer 162. A size of the P+ type Si epitaxial layer 162 in an in-plane direction of the substrate is smaller than that of the N+ type Si epitaxial layer 163. In addition, only the upper surfaces of the P+ type Si epitaxial layer 162 are in contact with the N+ type Si epitaxial layer 163.

In the light receiving device 1, it is desired to increase an SN ratio as much as possible. Therefore, in a light receiving device 100 according to the comparative example, to raise sensitivity, it is conceivable that an aperture ratio is increased and a light receiving area is increased. To increase the light receiving area, the size of the P+ type Si epitaxial layer 162 in the in-plane direction of the substrate can be increased. However, in this case, the distance between the adjacent photoelectric conversion elements 71, that is, the width of the separation film 130 disposed between the photoelectric conversion elements 71, decreases. If the width of the separation film 130 decreases, when a secondary photon is generated in a certain photoelectric conversion element 71, the secondary photon may enter another adjacent photoelectric conversion element 71. That is, in another photoelectric conversion element 71 adjacent to the photoelectric conversion element 71 in which the second photon is generated, crosstalk for detecting the second photon deteriorates and noise increases. As a result, the SN ratio cannot be increased only by increasing the aperture ratio. As described above, in the light receiving device 100 of the comparative example, it is difficult to decrease noise.

Meanwhile, in the first embodiment, the photoelectric conversion element 71 in which the P+ type Si epitaxial layer 162 is disposed to surround a side surface and a bottom surface of the N+ type Si epitaxial layer 163 is used. As described above, while the effective PN junction in the comparative example is a portion in which the upper surface of the P+ type Si epitaxial layer 162 having a small area is in contact with the bottom surface of the N+ type Si epitaxial layer 163, the effective PN junction area of the first embodiment increases. As a result, it is possible to increase the light receiving sensitivity compared to the comparative example. In addition, the light receiving sensitivity increases, and thus, it is not necessary to reduce the distance between the adjacent photoelectric conversion elements 71, and it is possible not to degrade the crosstalk.

In addition, the P+ type Si epitaxial layer 162 is disposed to surround the side surface and the bottom surface of the N+ type Si epitaxial layer 163, and thus, compared to a case that the N+ type Si epitaxial layer 163 is not disposed to surround the side surface and the bottom surface of the P+ type Si epitaxial layer 162, it is possible to increase the light receiving sensitivity. In particular, if the film thickness of the N+ type Si epitaxial layer 163 increases, the light receiving area increases, and thus, it is possible to further increase the light receiving sensitivity.

Second Embodiment

In the first embodiment, the example is described in which the shape of the photoelectric conversion element in a plan view is rectangular. However, the shape of the photoelectric conversion element in a plan view is not limited to the case of the above example. In the second embodiment, a case that the shape of the photoelectric conversion element in the plan view is another shape is taken as an example.

Figure 9A:
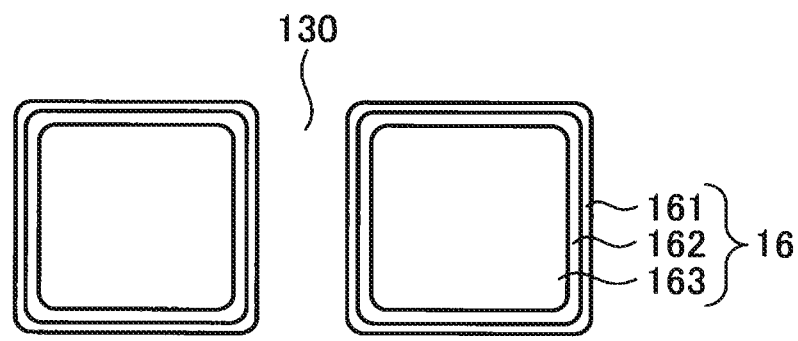
FIGS. 9A and 9B are plan diagrams schematically showing a portion of a pixel region of a light receiving device according to a second embodiment.
Figure 9B:
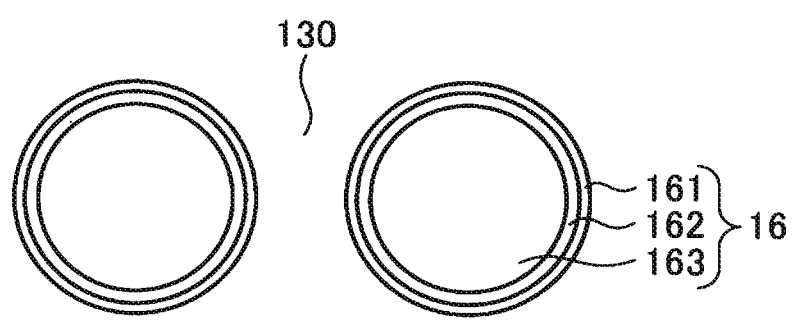

FIGS. 9A and 9B are plan diagrams schematically showing a portion of a pixel region of a light receiving device according to the second embodiment. In FIG. 9A, all of the P type Si epitaxial layer 161, the P+ type Si epitaxial layer 162, and the N+ type Si epitaxial layer 163 have a rectangular shape with a rounded corner. In FIG. 9B, all of the P type Si epitaxial layer 161, the P+ type Si epitaxial layer 162, and the N+ type Si epitaxial layer 163 have a circular shape. Moreover, in addition to the shapes shown here, each of the P type Si epitaxial layer 161, the P+ type Si epitaxial layer 162, and the N+ type Si epitaxial layer 163 may have an elliptical shape. Other configurations are the same as those of the first embodiment, and thus, the description thereof will be omitted.

As in the first embodiment, in the case that the shape of the photoelectric conversion element 71 has a rectangular shape in a plan view, an electric field concentration occurs at a corner portion. However, in the second embodiment, the Si epitaxial layer 16 has the rectangular shape with a rounded corner, circular shape, or the elliptical shape, and thus, as compared with the first embodiment, an effect of suppressing the electric field concentration can be obtained in addition to the effects of the first embodiment.

In the above descriptions, the P+ type Si epitaxial layer 162 is disposed to surround the side surface and the bottom surface of the N+ type Si epitaxial layer 163. However, the N+ type Si epitaxial layer 163 may be disposed to surround the side surface and the bottom surface of the P+ type Si epitaxial layer 162.

While certain embodiments have been described, these embodiments have been presented by way of example only, and are not intended to limit their scope. Indeed, the novel embodiments described herein may be embodied in a variety of other forms; furthermore, various omissions, substitutions and changes in the form of the embodiments described herein may be made without departing from the spirit of the embodiments. The accompanying claims and their equivalents are intended to cover such forms or modifications as would fall within the scope and spirit of the embodiments.

What is claimed is:

1. A light receiving device comprising:
first semiconductor layers provided on a first main surface of a semiconductor substrate and having a first conductivity type impurity at a first concentration;
an insulating film provided between the first semiconductor layers on the first main surface;
a photoelectric conversion element provided in the first semiconductor layer;
a first electrode provided on the insulating film on the first main surface; and
a second electrode provided on a second main surface opposite the first main surface of the semiconductor substrate,
wherein the photoelectric conversion element includes:
a second semiconductor layer provided at a predetermined depth from an upper surface of the first semiconductor layer on which the first electrode is disposed and having a second conductivity type impurity at a second concentration, and
a third semiconductor layer provided within the first semiconductor layer to surround a side surface and a lower surface of the second semiconductor layer and having the first conductivity type impurity at a third concentration higher than the first concentration.

2. The light receiving device according to claim 1, wherein each of the first semiconductor layer, the second semiconductor layer, and the third semiconductor layer has a rectangular shape in a plan view.

3. The light receiving device according to claim 1, wherein each of the first semiconductor layer, the second semiconductor layer, and the third semiconductor layer has a rectangular shape having a rounded corner in a plan view.

4. The light receiving device according to claim 1, wherein each of the first semiconductor layer, the second semiconductor layer, and the third semiconductor layer has a circular shape in a plan view.

5. The light receiving device according to claim 1, wherein each of the first semiconductor layer, the second semiconductor layer, and the third semiconductor layer has an elliptical shape in a plan view.

6. The light receiving device according to claim 1, wherein the first conductivity type is a P type, and wherein the second conductivity type is an N type.

7. The light receiving device according to claim 1, wherein the first conductivity type is an N type, and wherein the second conductivity type is a P type.

8. The light receiving device according to claim 1, wherein each of the first semiconductor layer, the second semiconductor layer, and the third semiconductor layer is formed of an epitaxial film.

9. The light receiving device according to claim 1, wherein the photoelectric conversion element is an avalanche photodiode that operates in a Geiger mode.

10. The light receiving device according to claim 1, wherein a cathode of the photoelectric conversion element is electrically connected to an electrode film via a quenching resistor.

11. The light receiving device according to claim 4, wherein the semiconductor substrate is a single crystal silicon substrate, and
wherein each of the first semiconductor layer, the second semiconductor layer, and the third semiconductor layer are an epitaxial film formed of silicon.

12. A light receiving device comprising:
first semiconductor layers provided on a first main surface of a semiconductor substrate and having a first conductivity type impurity at a first concentration;
an insulating film provided between the first semiconductor layers on the first main surface;
a photoelectric conversion element provided in the first semiconductor layer;
a first electrode provided on the insulating film on the first main surface; and
a second electrode provided on a second main surface opposite the first main surface of the semiconductor substrate,
wherein the photoelectric conversion element includes:
a second semiconductor layer extending from a top height of the first semiconductor layer to a first depth and narrower than a formation range of the first semiconductor layer in a plan view and having the first conductivity type impurity at a second concentration higher than the first concentration, and
a third semiconductor layer extending from a height of the second semiconductor layer to a second depth shallower than the first depth and narrower than a formation range of the second semiconductor layer in a plan view, and a side surface and a lower surface to be surrounded by the second semiconductor layer and having a second conductivity type impurity at a third concentration.

13. A method of manufacturing a light receiving device, comprising:
- forming an insulating film on a semiconductor substrate;
- forming, in the insulating film, an opening reaching the semiconductor substrate;
- forming, in the opening, a first semiconductor layer including a first conductivity type impurity at a first concentration;
- introducing the first conductivity type impurity at a second concentration higher than the first concentration to form a second semiconductor layer, in a range from an upper surface of the first semiconductor layer to a first depth and narrower than a formation range of the first semiconductor layer in a plan view; and
- introducing a second conductivity type impurity at a third concentration to form a third semiconductor layer, in a range from an upper surface of the second semiconductor layer to a second depth shallower than the first depth and narrower than a formation range of the second semiconductor layer in a plan view.

* * * * *